United States Patent
Magri et al.

(10) Patent No.: US 7,875,936 B2
(45) Date of Patent: Jan. 25, 2011

(54) POWER MOS ELECTRONIC DEVICE AND CORRESPONDING REALIZING METHOD

(75) Inventors: Angelo Magri, Belpasso (IT); Ferruccio Frisina, Sant' Agata Li Battiati (IT); Giuseppe Ferla, Acicastello (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 450 days.

(21) Appl. No.: 11/285,741

(22) Filed: Nov. 21, 2005

(65) Prior Publication Data

US 2006/0244059 A1 Nov. 2, 2006

(30) Foreign Application Priority Data

Nov. 19, 2004 (IT) ............ MI2004A2243
Nov. 19, 2004 (IT) ............ MI2004A2244
Nov. 19, 2004 (IT) ............ MI2004A2245

(51) Int. Cl.
*H01L 27/088* (2006.01)

(52) U.S. Cl. ............ 257/401; 257/213; 257/288; 257/365; 257/E29.242; 257/E29.255; 257/E29.256; 257/E29.257; 438/283; 438/284; 438/286

(58) Field of Classification Search .......... 257/401, 257/E29.118, 202, 213, 288, 365, E29.242, 257/E29.255–E29.257; 438/283, 284, 286
See application file for complete search history.

(56) References Cited

U.S. PATENT DOCUMENTS

| 4,145,700 A | * | 3/1979 | Jambotkar .......... 257/341 |
| 4,318,759 A | | 3/1982 | Trenary et al. |
| 5,254,494 A | | 10/1993 | Van Der Plas et al. |
| 5,445,978 A | | 8/1995 | Yilmaz |
| 5,510,281 A | | 4/1996 | Ghezzo et al. |
| 5,814,859 A | | 9/1998 | Ghezzo et al. |
| 5,933,734 A | | 8/1999 | Ferla et al. |
| 5,981,343 A | | 11/1999 | Magri et al. |

(Continued)

FOREIGN PATENT DOCUMENTS

JP 9082965 3/1997

(Continued)

OTHER PUBLICATIONS

European Search Report for EP 05 02 5288 dated Feb. 21, 2006.

(Continued)

*Primary Examiner*—Matthew E Warren
*Assistant Examiner*—John Lin
(74) *Attorney, Agent, or Firm*—Lisa K. Jorgenson; Kevin D. Jablonski; Graybeal Jackson LLP

(57) ABSTRACT

Power MOS device of the type comprising a plurality of elementary power MOS transistors having respective gate structures and comprising a gate oxide with double thickness having a thick central part and lateral portions of reduced thickness. Such device exhibiting gate structures comprising first gate conductive portions overlapped onto said lateral portions of reduced thickness to define, for the elementary MOS transistors, the gate electrodes, as well as a conductive structure or mesh. Such conductive structure comprising a plurality of second conductive portions overlapped onto the thick central part of gate oxide and interconnected to each other and to the first gate conductive portions by means of a plurality of conducive bridges.

13 Claims, 10 Drawing Sheets

U.S. PATENT DOCUMENTS

| | | | |
|---|---|---|---|
| 6,215,152 | B1 | 4/2001 | Herbert |
| 6,222,232 | B1 | 4/2001 | Magri et al. |
| 6,326,271 | B2 | 12/2001 | Magri et al. |
| 6,423,986 | B1 | 7/2002 | Zhao |
| 6,596,609 | B2 | 7/2003 | Cheng et al. |
| 6,979,863 | B2 | 12/2005 | Ryu |
| 2002/0093033 | A1 | 7/2002 | Zommer et al. |
| 2002/0140042 | A1 | 10/2002 | Stout |
| 2003/0057497 | A1 | 3/2003 | Higashida et al. |
| 2004/0031981 | A1 | 2/2004 | Grivna |
| 2004/0142531 | A1 | 7/2004 | Chan et al. |
| 2004/0185646 | A1 | 9/2004 | Herzum |
| 2005/0145852 | A1 | 7/2005 | Kumar et al. |
| 2006/0086974 | A1 | 4/2006 | Balakrishnan |

FOREIGN PATENT DOCUMENTS

| | | |
|---|---|---|
| WO | WO 99/33119 A | 7/1999 |

OTHER PUBLICATIONS

Shenai K et al.: "Selectively Silicided Vertical Power Double-Diffused Metal-Oxide Semiconductor Field Effect Transistors for High-Frequency Power Switching Applications", Journal of Vacuum Science and technology Part B, vol. 6, No. 6, Nov. 1988, pp. 1740-1745.

Europea Search Report for EP 05 02 5285 dated Mar. 3, 2006.

European Search Report for EP 05 02 5287 dated May 29, 2006.

Berger, Wayne, et al., RF-LDMOS: A Device Technology for High Power RF Infrastructure Applications, XP010767463, IEEE pp. 189-192, Oct. 24, 2004.

Antipov I, Mask-Independent Short Channel MOS, XP000671029, IBM Technical Disclosure bulletin, vol. 21, No. 12, pp. 4852-4854, May 1, 1979.

* cited by examiner

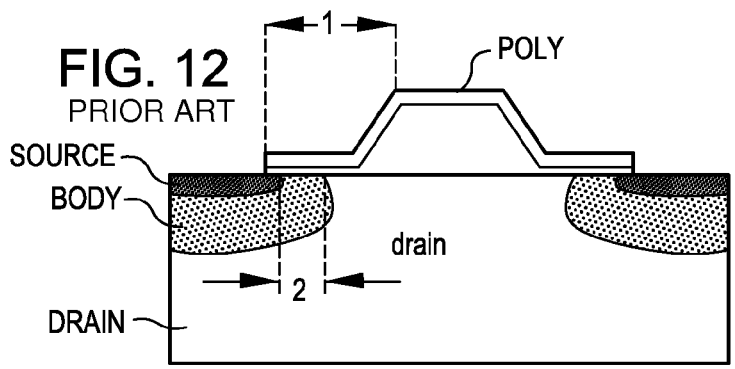
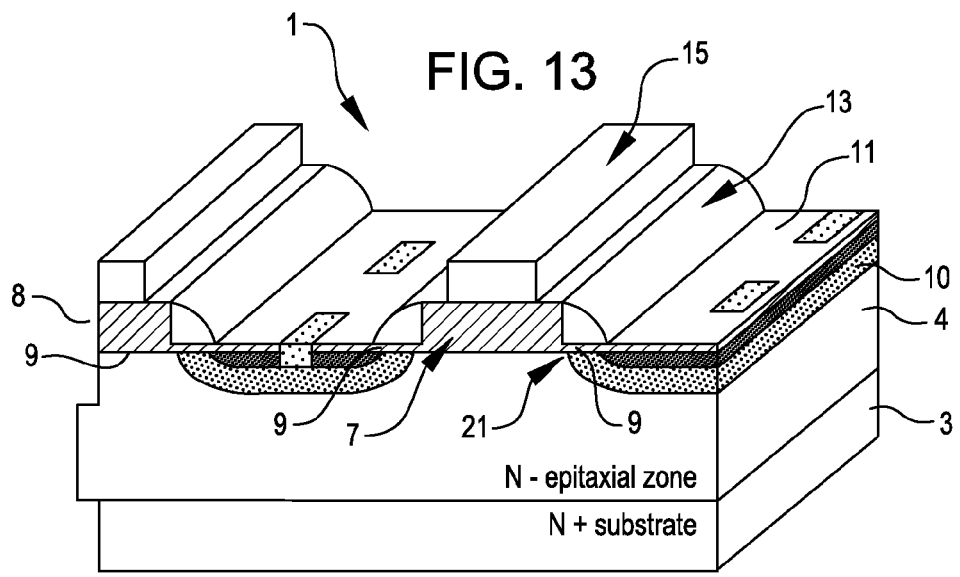
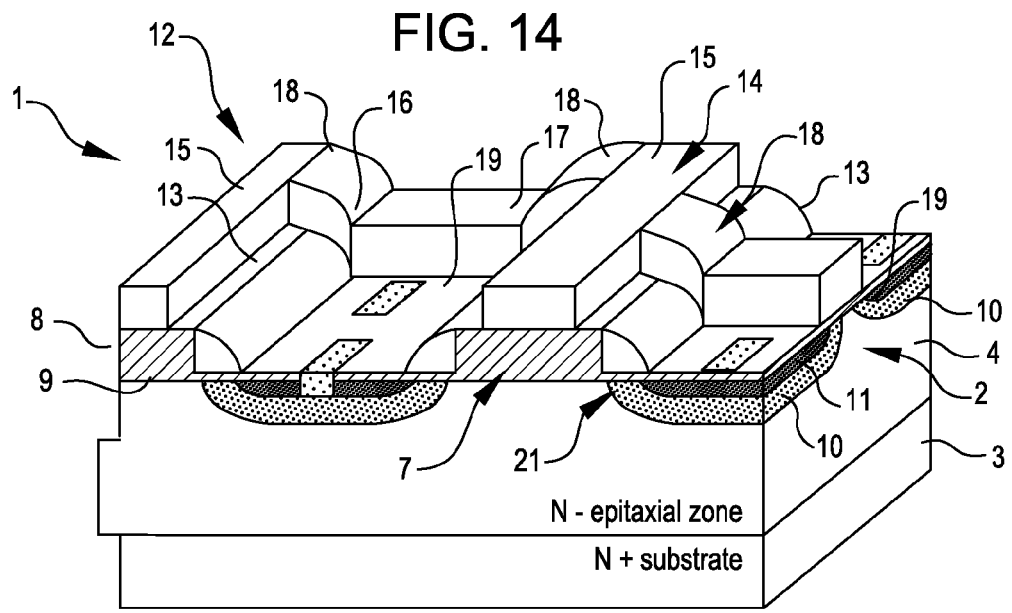

PROPOSAL

POWER MOS ELECTRONIC DEVICE AND CORRESPONDING REALIZING METHOD

CROSS REFERENCE TO RELATED APPLICATIONS

This application is related to U.S. patent application Ser. Nos. 11/285,759 entitled SWITCHING-CONTROLLED POWER MOS ELECTRONIC DEVICE, and Ser. No. 11/285,742 entitled METHOD FOR MANUFACTURING A HIGH INTEGRATION DENSITY POWER MOS DEVICE, which have a common filing date and owner and which are incorporated by reference.

PRIORITY CLAIM

This application claims priority from Italian patent application Nos. MI2004A 002244, filed Nov. 19, 2004, MI2004A 002245, filed Nov. 19, 2004, and MI2004A 002243, filed Nov. 19, 2004, which are incorporated herein by reference.

TECHNICAL FIELD

The present invention relates generally to a power electronic device, such as a MOS device, of the type comprising a very high integration of elementary MOS transistors and used in multiple applications both at low and high supply voltage.

The invention also relates to a method for realizing the power electronic MOS device with improved dynamic performances.

The invention particularly, but not exclusively, relates to a power electronic MOS device and the following description is made with reference to this field of application by way of illustration only.

BACKGROUND

As it is well known, in power electronic devices, in particular in power devices of the MOS type, it is important to have the possibility of operating at higher and higher frequencies while maintaining a high component reliability.

Nowadays the uses of MOS devices in fact often require the possibility of operating, both at low supply voltage (20-100V) and at high supply voltage (200-1000V), but, however, at higher and higher frequencies approaching one megahertz (MHz).

Power devices are thus subjected to very high voltage and current gradients during the transients and/or during the switchings, which may make the stresses to the device weakening the same burdensome and reduce its lifetime drastically.

As it is well known, some power MOS devices are realized by thousands or millions of elementary MOS transistors placed in parallel and individually contributing to the overall current capacity of the device.

Typically, elementary MOS transistors, as highlighted in FIG. 1, are realized on semiconductor or with polygonal cells or strips and they comprise a body region, which, in the case shown, is of the p type, formed on a suitable substrate, of the n type, and with a source region realized on top.

The body region, together with the source region, form a channel region covered by an insulating layer, for example a silicon oxide, and by a conductive layer, for example suitably doped polysilicon.

These two insulating and conductive layers represent, for each elementary MOS transistor, the gate dielectric and for the power MOS device they form a biasing mesh also called gate the mesh.

The gate mesh is connected to a terminal called gate pad and it allows the distributing of the signals inside the MOS device as well as the turning on and/or off all the elementary MOS transistors composing the power MOS device.

The gate mesh, due to the high polysilicon resistivity (>10 Ohm/$_{[square]}$), exhibits resistive contributions along the path which depend on the relative position with respect to the gate pad, as highlighted in the circuit of FIG. 2. This implies that gate resistance value of each elementary transistor also depends on the distance from the gate pad.

Thus, each elementary MOS transistor, at each switch of the MOS device, responds with a time constant which, being, as known, a function of the input capacitance and of the gate resistance, will be distinct for each elementary MOS transistor.

The gate resistance is thus an important value because, together with the input capacitance of the MOS device, forms an RC circuit whose time constant is one of the most important parameters influencing the switch speed of power electronic MOS devices. These latter devices, having to operate at higher and higher frequencies, thus require a more and more reduced time constant. Consequently, manufacturers are thus trying to reduce the gate resistance, making it homogeneous for the entire MOS device so as to ensure a greater reliability in high frequency applications.

To try and solve such problem, a known technique is that of carrying out a suitable metallization of the gate, a process including creating connection buses, also called gate fingers, realized in metallic material, so as to connect the gate pad to various points of the gate mesh by "short-circuiting" them, as shown in FIG. 3 and in the corresponding circuit of FIG. 4.

A related technique is that of increasing the number of gate fingers so as to intersect the gate mesh at a greater number of points.

Although advantageous in several aspects, such a solution exhibits different drawbacks, the main one being that the presence of the gate fingers realized in metallic material reduces the active area of the power MOS device, since below the gate fingers it is often not possible to integrate the elementary MOS transistors.

Moreover, a further drawback linked to the presence of the gate fingers is due to the fact that they may limit the number and the position of the wires connecting to the source pad, thus negatively affecting the output resistance of the power MOS device.

A further known solution to reduce the gate resistance provides the decrease of the gate mesh resistance by integrating there inside a very conductive layer. Referring to FIG. 5, such a process makes use of metallic silicides, such as for example cobalt silicide ($CoSi_2$), platinum silicide (PtSi), titanium silicide ($TiSi_2$) or tungsten silicide ($WSi_2$), which exhibit a layer resistivity of about one order of magnitude lower with respect to that of the unsilicided polysilicon.

For power electronic MOS devices used in faster and faster applications with low gate resistance, problems, however, emerge linked to the great voltage and current gradients during the transients.

All the solutions proposed to reduce the gate resistance exhibit the drawback that two elementary MOS transistors placed at different distances from the gate pad are "unbalanced" with respect to each other in the sense that they exhibit two different gate resistance values and thus two different switch speeds. This effect is more and more evident as faster and faster devices are realized.

FIG. 6 highlights a pattern in parallel of different elementary MOS transistors which exhibit different gate resistances according to the position wherein they are with respect to the gate pad and to the gate fingers.

The diagram in FIG. 7 shows how between elementary MOS transistors where there exists an unbalance in the resistance value, during the switch step of the MOS device, different wave forms are produced which distribute the current at stake in a non uniform way. In particular it can be verified how, the current intensity, 12, crossing the slowest component undergoes sudden increases affecting the uniformity of the overall time constant of the electronic MOS device.

Such behavior in the power MOS device is exponentially increased relative to an increase in the plurality of elementary MOS transistors. This, however, may jeopardize both the correct functionality and the operating lifetime of the MOS device itself.

For the manufacturing process used in the realization of a power electronic MOS device, it is inevitable that there are unbalances in the current flow. In fact it is good to remember that the distance between one gate finger and the other is around 200-2000 μm and in such space many elementary MOS transistors are disposed whose gate biasing occurs by means of the gate mesh. In such case the elementary MOS transistors closer to the gate fingers often will be the fastest while the others will often be slower and slower, as highlighted in FIG. 8.

Further unbalances are due to the fact that because for problems due to the assembling step it is often difficult to realize continuous and equidistant gate fingers (FIG. 9). Thus, the power MOS device obtained will exhibit areas with different distances between the gate fingers, as shown in the example of FIG. 9, and this implies the presence of a gate resistance influenced by the area with a shorter distance between the gate fingers, since in the calculation of the total resistance of these parallel resistances the areas with higher resistance will have less weight.

Moreover, it is good to reveal that although the resistivity of the material used for realizing the gate fingers is low, it is possible that the lengths of the fingers is such as to introduce resistive contributions that are significant as compared with the total gate resistance of the power electronic MOS device especially if, for lowering the metallization mesh resistance, metallic silicides are used.

As highlighted in the example of FIG. 10 and in the associated circuit of FIG. 11, the areas in correspondence with the points A and B, although being near the gate finger, exhibit a different resistance in series due to the contribution of the gate finger section AB, which could have an even higher resistance than one Ohm, with a consequent unbalance between the different areas of the power MOS device.

All these causes lead to having power electronic MOS devices weakened by the presence of areas having different gate resistances with consequent negative effects on the switching and during the extreme dynamic stresses with high values of dV/dt and/or dI/dt.

The unbalance can also cause current localizations that can cause the incorrect operation and/or the destruction of the power MOS device.

It is also known that power electronic MOS devices, especially with low voltage driving, for example those driven by means of driver with output voltage 1.8-2.5 Volt, exhibit a more and more reduced thickness of the gate oxide, typically silicon oxide. This reduction allows for threshold voltage values lower than 1 Volt without deteriorating the breakdown characteristics of the power electronic MOS device.

However, the reduction of the gate oxide thickness, together with the higher integration density, implies shallower deep junctions and shorter and shorter circuit lengths, with consequent increase of the capacitances of the elementary MOS transistors and of the total capacitance and with a slowdown of the response time during the switchings.

To try to reduce the capacitance using gate oxides other than silicon dioxide, it is known, for example, to use hafnium oxide, aluminum oxide, silicon oxide/silicon nitride multilayers and others.

Changes in the composition of the material used, however, imply drawbacks mainly linked to the necessary testing, which may require excessively long and prohibitive development times for the current market of power electronic MOS devices.

A further known technique to reduce the total capacitance of the device is that of varying the geometry of the gate oxide; such solution provides the realization of the gate oxide with two different thicknesses in active area as shown for power VDMOS devices, both with n channels and with p channels, in U.S. Pat. Nos. 6,222,232 and 6,326,271, which are incorporated by reference.

In such proposed solutions the gate dielectric exhibits two thicknesses: a thin one realized above the channel region, which allows a low threshold voltage driving, and a thicker one extended to the region of the gate/drain capacitor, which allows a significant reduction in the transient capacitance of the device and thus also the input capacitance.

The procedure to define the gate structure in the VDMOS devices, according to the prior art, mainly requires a thermal growth of a thick silicon oxide film from the underlying substrate, and a photolithographic definition in active area regions and a growth of a thin gate oxide film which will surmount the channel.

Such known technique provides the use of a photolithographic step to define the part of the thick gate electrode in the elementary MOS transistor and it provides a successive and more important photolithographic step to delineate the geometry of the gate electrode.

Considering that in the elementary MOS transistor there is the need of having a symmetrical and uniform diffused channel using a known procedure, realizing power MOS devices with double oxide thickness imposes a margin, with quite high value, between the delimitation of the gate electrode and the edge of the central thick oxide region, as it can be seen in FIG. 12.

Such margin labeled with <<1>> in FIG. 12 typically must be sufficiently wide so as to ensure that possible misalignments in the photolithographic definition of the gate electrode do not cause the extension of the channel below the thick oxide region in an asymmetrical way, on the other hand.

Obviously, the need of safeguarding the alignment of the planar structures in active area goes against the need of a greater and greater integration of power MOS transistors and thus against the need of operating with more and more reduced dimensions.

There exist realizations, obtained by using solutions as highlighted for example in the US Patent Publication No. 2002/0140042A1, which is incorporated by reference, which allow to obtain high integration density devices with self-aligned gate oxide regions. Such realizations, although advantageous under several aspects, exhibit the drawback of significantly reducing the gate mesh in thickness and width and thus they remarkably increase the gate resistance. Moreover, in such known realizations the problems for introducing a silicide layer inside the gate mesh have significantly increased.

SUMMARY

Therefore, a need has arisen for a power electronic MOS device with a high integration density, thus comprising a plurality of elementary MOS transistors with such a gate structure as to ensure a substantially simultaneous switch and with substantially the same time constant, exhibiting such structural and functional characteristics as to overcome some or all of the drawbacks cited above with reference to the prior art.

An embodiment of the present invention is a power MOS device, comprising a plurality of elementary MOS transistors, exhibiting an oxide region with double thickness, comprising a first conductive portion or mesh overlapped onto a part of the oxide with greater thickness and a second conductive portion or gate electrode of the elementary MOS transistors overlapped onto a part of the oxide with thin thickness and the two conductive portions placed in electric connection by means of suitable conductive bridges.

BRIEF DESCRIPTION OF THE DRAWINGS

Characteristics and advantages of a power MOS device and of a method will be apparent from the following description of embodiments thereof given by way of indicative and non limiting example making reference to the annexed drawings.

FIG. 12 shows a section of an embodiment of a structure with a gate oxide having double thickness according to the prior art.

FIGS. 13 and 14 show portions of a power MOS device realized according to an embodiment of the present invention, respectively in an intermediate process step and once the device is completed.

DETAILED DESCRIPTION

Figure 1:
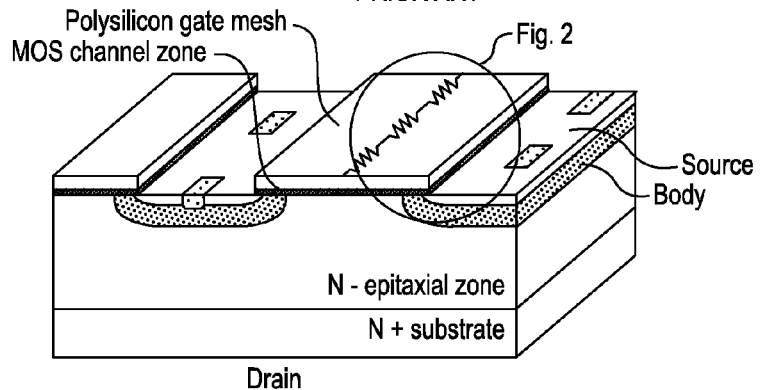
FIGS. 1 to 4 show two embodiments of a power electronic MOS device according to the prior art with the corresponding equivalent circuit.
Figure 2:
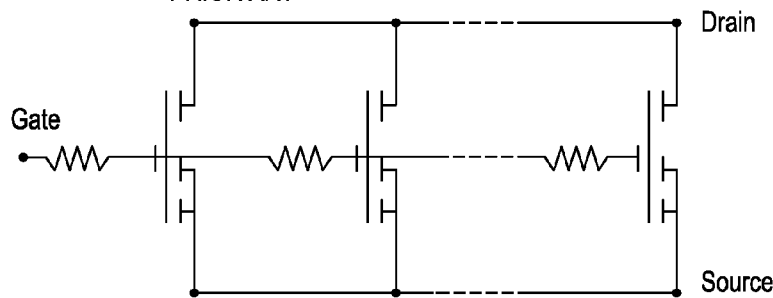
Figure 3:
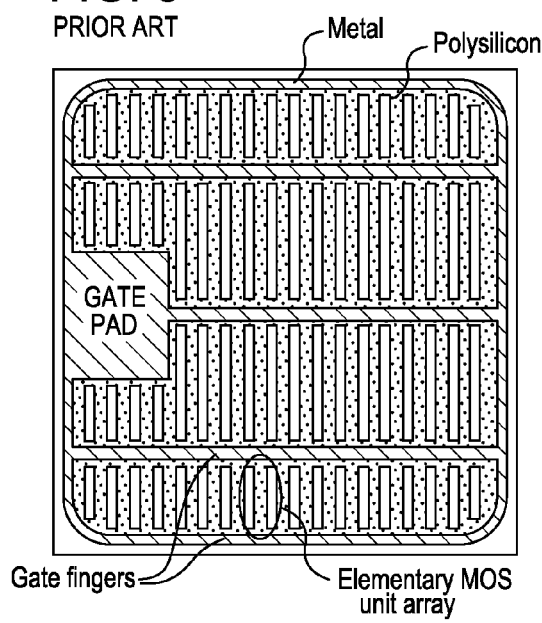
Figure 4:
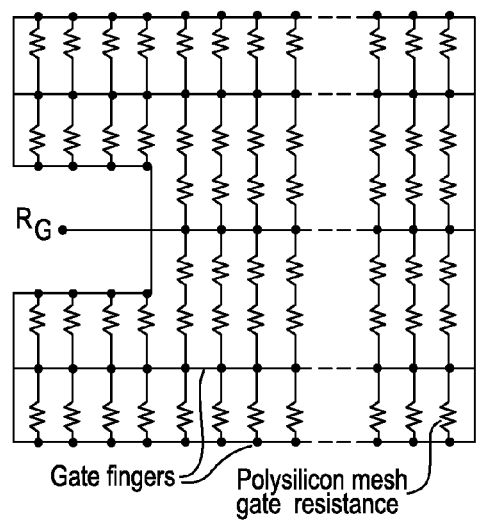
Figure 5:
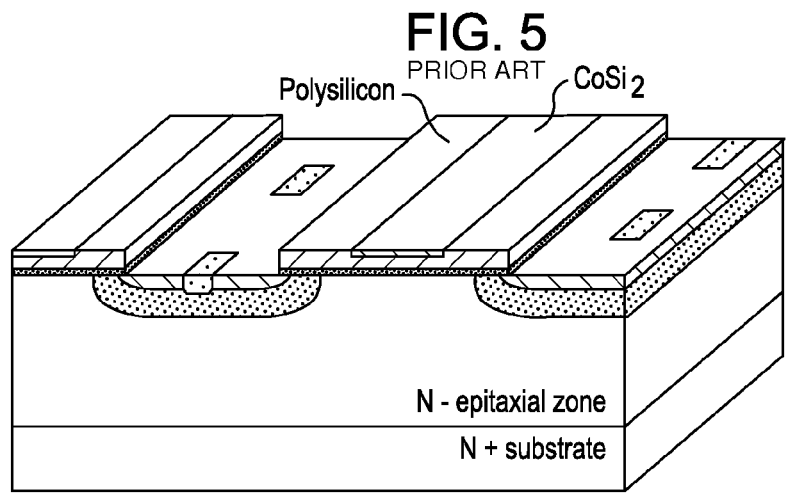
FIG. 5 shows a further embodiment of a power MOS device according to the prior art.
Figure 6:
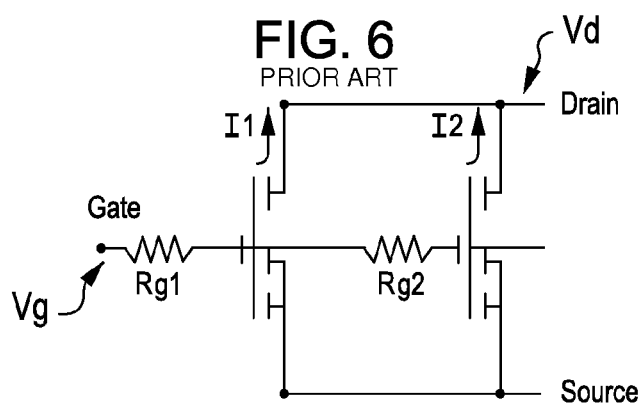
FIGS. 6 and 7 show an electric circuit and a diagram reporting the wave forms in voltage and current during a turn off transient of two elementary MOS transistors of a power MOS device realized according to the prior art.
Figure 7:
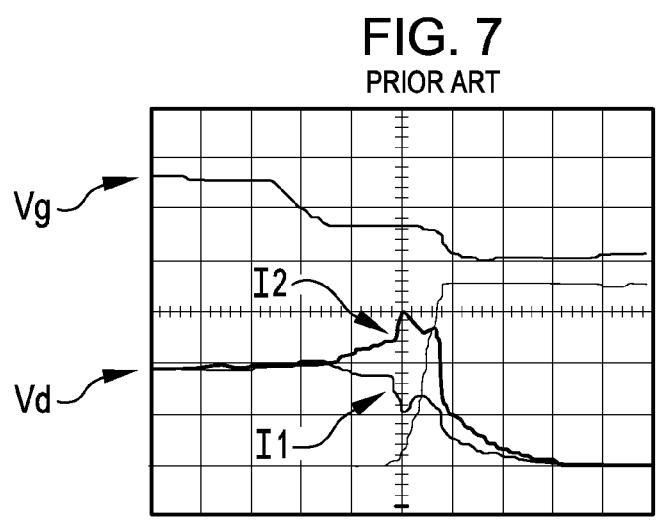
Figure 8:
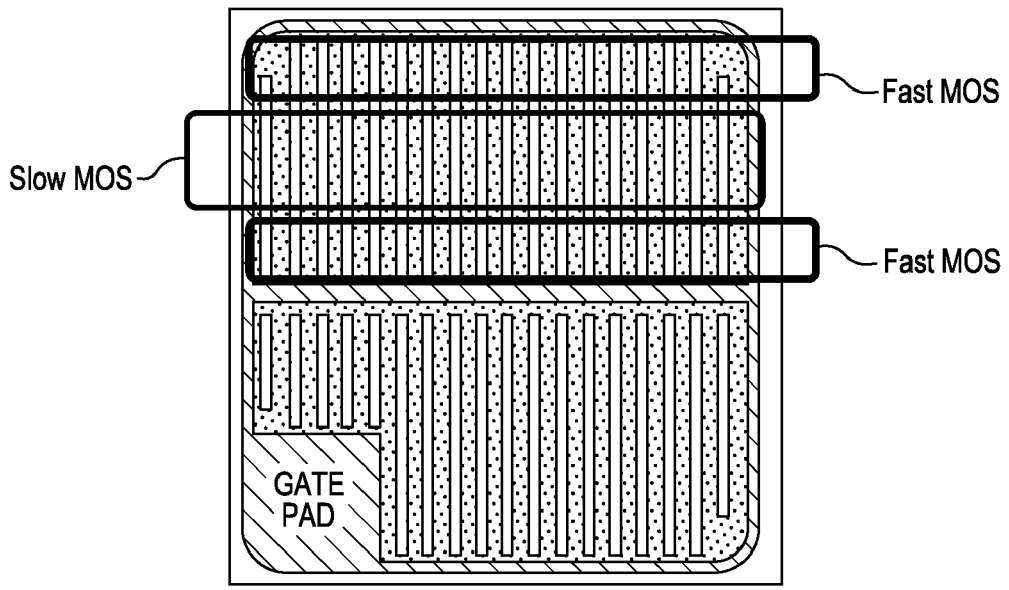
FIGS. 8 to 10 show the layout of three different embodiments of a MOS device according to the prior art.
Figure 9:
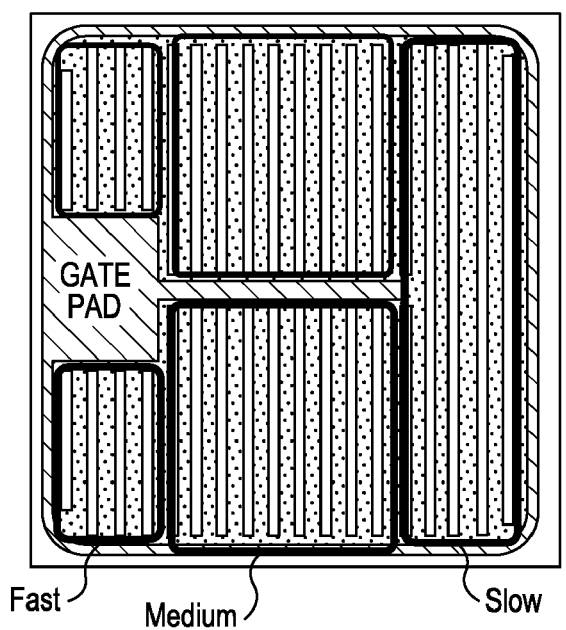
Figure 10:
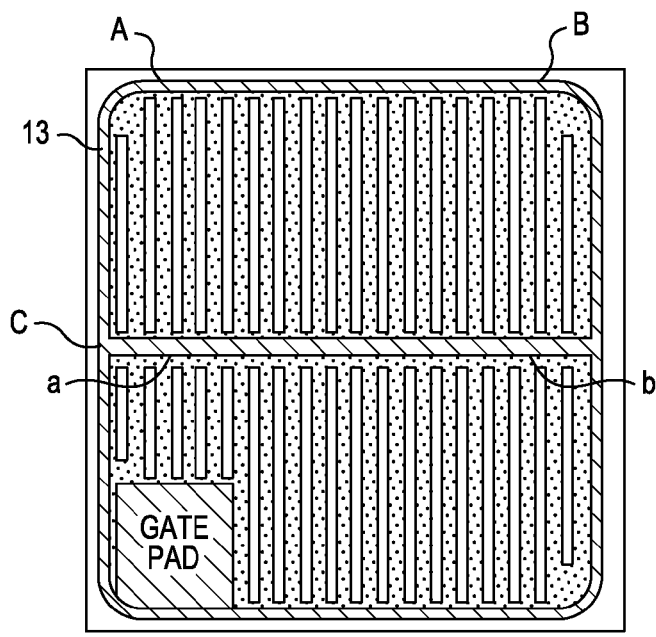
Figure 11:
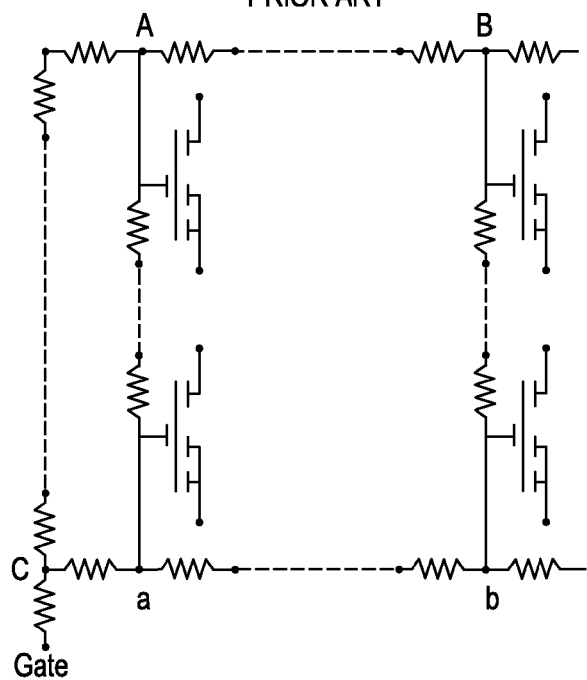
FIG. 11 shows an equivalent electric circuit of the device of FIG. 10.

With reference to such figures, and in particular to the example of FIG. 14, 1 globally and schematically indicates a power MOS device realized according to an embodiment of the present invention.

The device 1 comprises a plurality of elementary MOS transistors 2 realized on a silicon plate comprising a semiconductor layer 4 disposed on a substrate 3. The layer 4 exhibits a first type of conductivity which, in the case highlighted in the figure, is of the N-type while the substrate 3 is of the N+ type.

The elementary MOS transistors 2 exhibit a body region 10, realized in a second type of conductivity, and a source area 11 disposed on top.

Suitably, the elementary MOS transistors 2 exhibit gate structures 12 comprising a gate oxide 7, of the type with double thickness, comprising in turn a thick central part 8 and lateral portions 9 with reduced thickness, as also highlighted in FIG. 13.

Naturally, the profile of the gate oxide 7 and in particular of the central part 8 can be various and, in the case shown, the gate oxide 7 exhibits a shape substantially like an upside-down "T".

Advantageously, the gate structures 12 comprise first gate conductive portions 13 disposed on the lateral portions 9 of the gate oxide 7 to define gate electrodes for the elementary MOS transistors 2.

The first conductive portions 13, realized in material such as for example polysilicon, flank the central part 8 of the gate oxide 7 and they exhibit, in the example of the figures, a substantially rounded profile, naturally they can exhibit any other profile. These first gate conductive portions 13 can also be realized with a double layer made of polysilicon and of a metallic silicide.

Moreover, advantageously, the gate structures 12, as highlighted in FIG. 14, comprise a conductive structure or mesh 14 suitable to distribute the signal coming from a gate pad or from a finger, which is suitably defined on the upper surface of the silicon plate and which is not shown in FIGS. 13 and 14.

The conductive mesh 14 advantageously comprises second conductive portions 15 disposed on the thick central part 8 of the gate oxide 7 and suitably contained therein, interconnected to each other and to the first conductive portions 13 by a plurality of conductive bridges 16.

The second conductive portions 15 and the conductive bridges 16 are realized in material such as for example polysilicon and they can be suitably doped.

Advantageously, the second conductive portions 15 being placed above the central thick part 8 can be made very conductive by hyper-doping.

Figure 22:
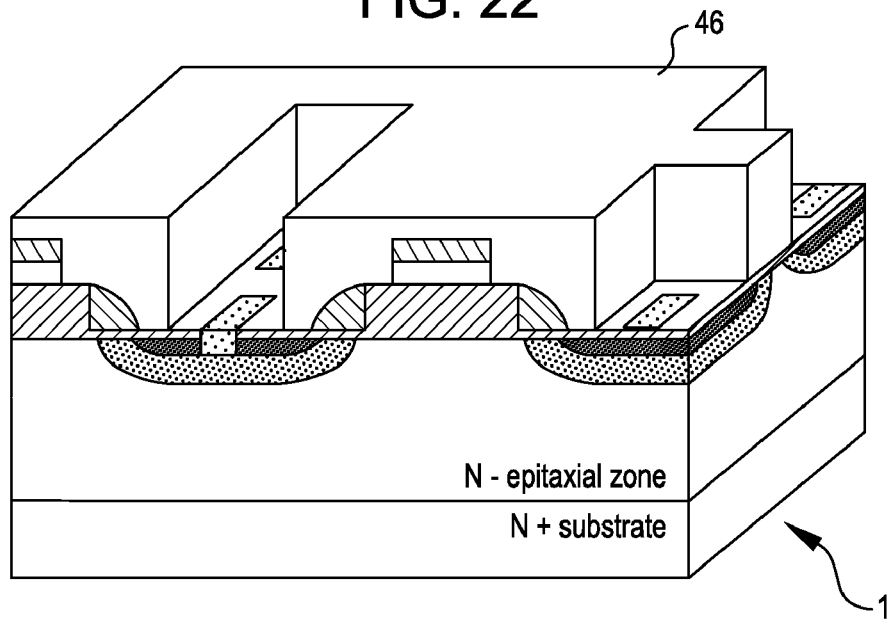
FIGS. 22 and 23 show portions of a power MOS device realized according to an embodiment of the present invention respectively at an intermediate and final completion step.
Figure 23:
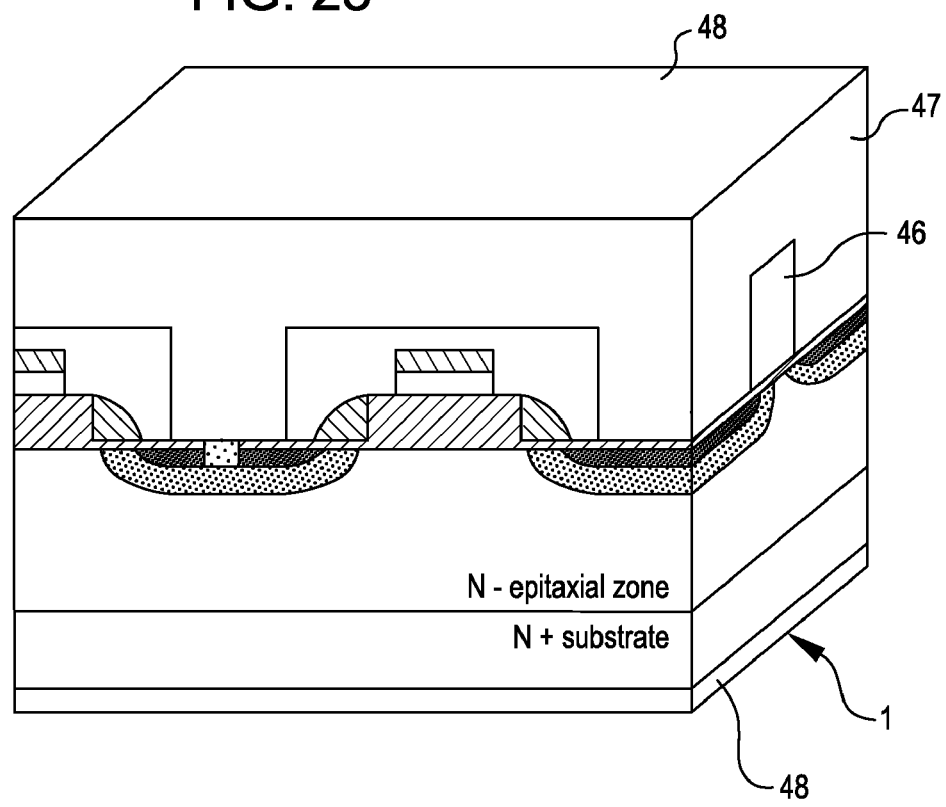

In particular, these second conductive portions 15 can be realized in polysilicon suitably doped for being then, by means of suitable process, transformed, for the whole thickness or only for part thereof, into a metallic silicide 50 as highlighted in the embodiments disclosed in conjunction with FIGS. 22 and 23.

Figure 19A:
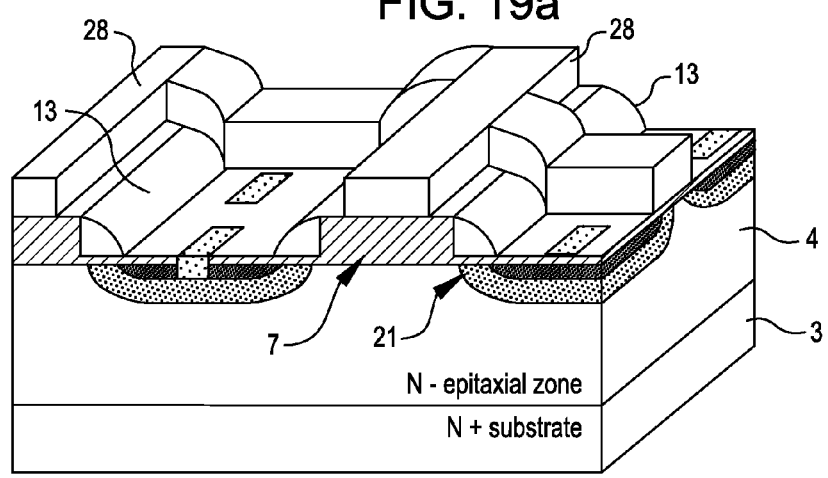
FIGS. 19a and 19b show respective partial views of a MOS device according to respective embodiments of the present invention.
Figure 19B:
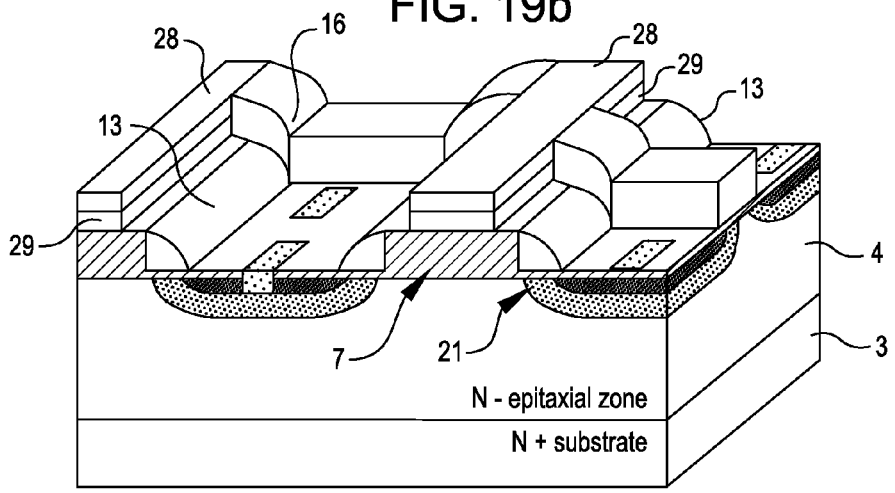

Suitably, the second conductive portions 15 can be realized, entirely as highlighted in FIG. 19a, in a metallic layer 28 or, as highlighted in FIG. 19b, they can be realized in a metallic layer 28 disposed on a polysilicon layer 29. These realizations improve the conductivity of the conductive mesh 14, without jeopardizing the functionality of the gate electrode or first conductive portions 13 being separated therefrom although connected by means of the conductive bridges 16.

In fact, the conductive bridges 16 are transversally arranged between second consecutive conductive portions 15 and they comprise a flat portion 17, disposed on the semiconductor layer 4, and curved ends 18 arranged above the first conductive portions 13 adjacent to said second consecutive conductive portions 15, thus allowing to connect them electrically.

Figure 21:
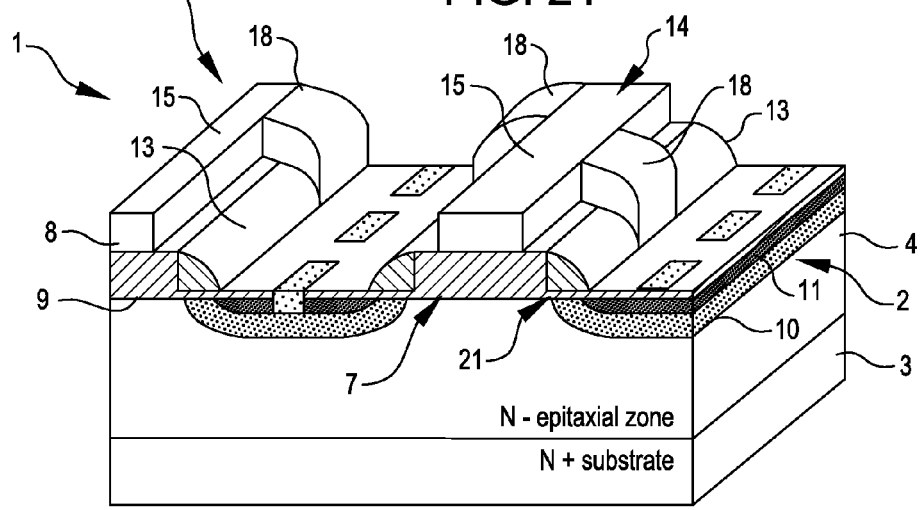
FIG. 21 shows a portion of a power MOS device realized according to a further embodiment of the present invention.

Advantageously, the flat portion 17 of each conductive bridge 16, can be partially interrupted or completely eliminated for reducing the capacitances associated therewith as highlighted in FIG. 21.

Advantageously, the conductive bridges 16 further allow electrical connection of the second conductive portions 15 to the first underlying conductive portions 13 allowing a relatively uniform distribution of the signal coming from the gate pad or from a gate finger to the elementary MOS transistors 2.

Naturally, the number and the mutual distance of the conductive bridges 16 may influence the speed of the power MOS device 1 and the propagation modes of the signal coming from the gate pad are thus suitably programmed and defined accordingly.

Between the flat portion 17 of the conductive bridges 16 and the underlying semiconductor layer 4 there is an insulating interconnection portion 19, realized in material such as for example oxide, which prevents electric contact between the two parts.

Advantageously, one part or the entire insulating interconnection portion 19 can be formed simultaneously with the central part 8 of the gate oxide 7, thus exhibiting such a thickness as to allow an incredible gain on the capacitances associated therewith. Alternatively, the portion 19 can be formed simultaneously with the lateral portion 9 of the gate oxide 7.

Suitably, the body regions 10 of the elementary MOS transistors 2 are realized between two consecutive conductive bridges 16, they are insulated from each other, and they exhibit a peripheral diffusion below the lateral portions 9 of the gate oxides 7 and of the surrounding conductive bridges 16 to define channel regions 21.

The power MOS device 1 realized according to an embodiment of the present invention thus exhibits a gate structure 12 effectively allowing separate transmission lines for the signal in the power MOS device 1 by realizing the conductive mesh 14 and the first conductive portions 13.

Moreover, the use of a gate oxide 7 with double thickness may improve the dynamic operation of the power MOS device.

Figure 16:
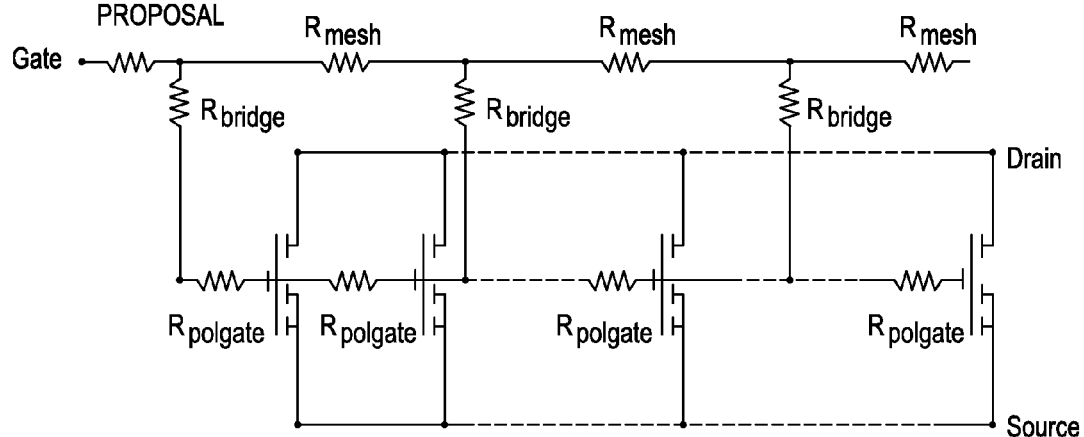

More in particular, the dynamic response of the MOS device 1 is improved and balanced, in fact, considering an electric circuit relative to the elementary MOS transistors 2 according to an embodiment of the present invention and reported in FIG. 16, it is evident how each elementary MOS transistor 2 is connected to the gate pad or to a gate finger by means of the conductive structure or mesh 14, which is represented by a resistance given by the series of the resistances Rmesh and Rbridge and which is placed in parallel with the resistance of the first conductive portion 13, or gate electrode, indicated as Rpolgate.

Moreover, the conductive mesh 14 being arranged above the thick central part 8 of the gate oxide 7, this causes the resistance series $R_{mesh}$ and $R_{bridge}$ to typically be much smaller than the resistance of the gate electrode $R_{polgate}$, thus having a lower contribution to the overall gate resistance.

Figure 15:
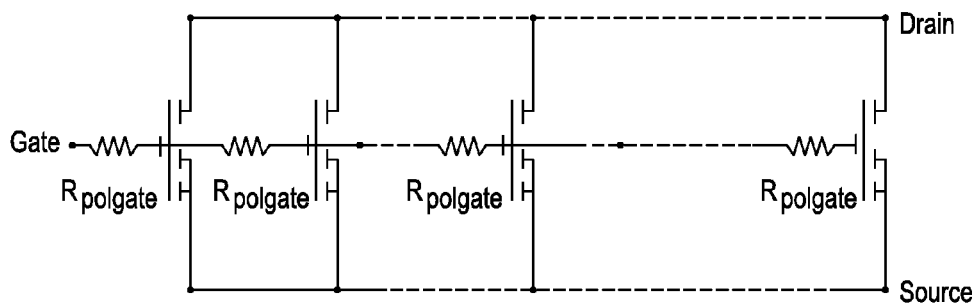
FIGS. 15 and 16 show a circuit scheme respectively of a MOS device realized according to the prior art and according to an embodiment of the present invention.

In such way the elementary MOS transistors 2 placed farther from the gate pad or from the gate finger will often be faster with respect to a configuration according to the prior art wherein the mesh structure is also the gate electrode of the elementary MOS transistors 2 ($R_{polgate}$) as highlighted in FIG. 15. Vice versa, those placed closer to the gate pad or to the finger will often be slowed down, and this acts to make more uniform the time constant of the plurality of elementary MOS transistors 2, thus balancing the dynamic response of the power MOS device 1.

An embodiment of the invention also relates to a method for realizing a power MOS device shown making reference to FIGS. 20a to 20h.

The realization steps and the structures described hereafter do not form a complete process flow for the realization of power MOS devices. In fact this embodiment can be put into practice together with the realization techniques of the MOS devices currently used in the field and hereafter are only those steps necessary for the comprehension of this embodiment.

The power MOS device realized is that shown in FIGS. 22 and 23 and it is of the type comprising a plurality of elementary power MOS transistors 2.

Hereafter the same above-indicated reference numbers will be used for identifying corresponding parts.

The realization method according to an embodiment of the invention includes the following steps:

making a thick oxide layer with thickness values comprised between 3000-13000 Å grown, according to the prior art, on a semiconductor layer 4 of a silicon wafer;

providing a photomasking by means of the placement of a resist 41 on the thick layer for defining a plurality of gate oxides 7, according to the prior art;

anisotropically etching the thick layer to realize a plurality of central parts 8 with relatively large thickness;

removing the resist;

realizing an oxide layer with reduced thickness, comprised between 150-1500 Å to form lateral portions 9 of the gate oxides 7 and to form a plurality of interconnection portions 19 transversally connecting the lateral portions 9.

Advantageously, the walls of the central part 8 of the gate oxide 7 can be vertical to allow the formation of suitable polysilicon spacers.

Possibly, the interconnection portions 19 can be obtained simultaneously with the central parts 8 by means of the anisotropic etching to the oxide thick layer.

Figure 20A:
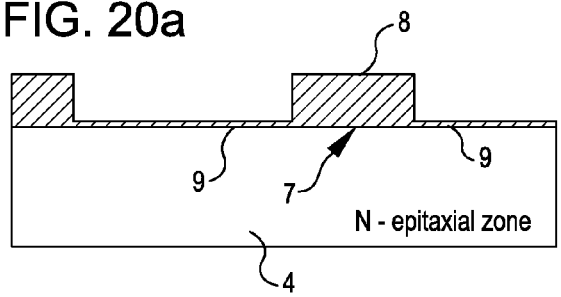
FIGS. 20a to 20h show some steps of the manufacturing process of a power MOS device according to an embodiment of the present invention.
Figure 20B:
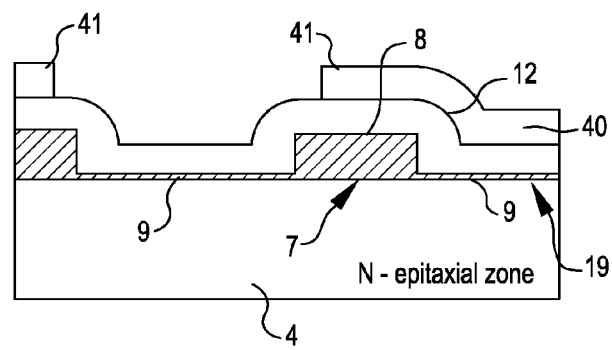
Figure 20C:
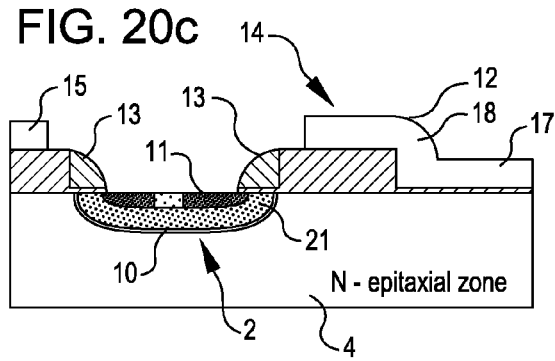

The method further provides the steps of:

depositing, above the layer 4, a conductive layer 40 with thickness of about 2000-8000 Å as highlighted in FIG. 20b. The conductive layer 40, realized for example in polysilicon, can be suitably doped if necessary for the application;

providing a photo-masking of the conductive layer 40, by placing a resist 41, to define a conductive mesh 14 of a gate structure 12 suitable to distribute a signal coming from a gate pad or from a finger, suitably defined on an upper surface of the silicon wafer and not highlighted in the figures;

anisotropically etching the conductive layer 40 to realize first conductive portions 13, of the gate structure 12, disposed on the lateral portions 9 of the gate oxide 7, as highlighted in FIG. 20c.

Advantageously, the conductive mesh 14 is of the type comprising a plurality of second conductive portions 15 disposed on the central part 8 of the gate oxide 7, and a plurality of conductive bridges 16 disposed on the interconnection portions 19.

Moreover, an anisotropic etching typology will be suitably used to leave a residue, also called spacer, along the walls of the etched material. This causes said first conductive portions 13 or gate electrodes of the elementary MOS transistors 2 to self-aligned to the body regions 10.

The process then includes the step of:

removing the resist.

Advantageously according to an embodiment of the present invention, the gate structure 12 comprises a plurality of first conductive portions 13 disposed on the lateral portions 9 of the gate oxide 7 and a conductive structure or mesh 14 which in turn comprises a plurality of second conductive portions 15 disposed on the central thick part 8 of the gate oxide 7 and interconnected to each other and to the first conductive portions 13 by a plurality of conductive bridges 16 disposed on the interconnection portions 19.

Suitably, the conductive bridges 16 exhibit a flat portion 17, arranged transversally between first consecutive conductive portions 13 and two curve ends 18 which are placed above and transversally to said first conductive portions 13 to reach corresponding second conductive portions 15. The conductive bridges 16 thus allow electrical connecting second consecutive conductive portions 15 to each other and to connect them to corresponding first portions 13.

The process further includes the step of:

forming a plurality of body wells to realize body regions 10 and source wells to realize source areas 11 according to the prior art, as highlighted in FIG. 20c.

In particular the body regions 10, arranged between successive conductive bridges 16, exhibit a peripheral diffusion below said lateral portions 9 of the gate oxide 7 and of the surrounding conductive bridge 16 to realize channel regions 21.

Figure 20D:
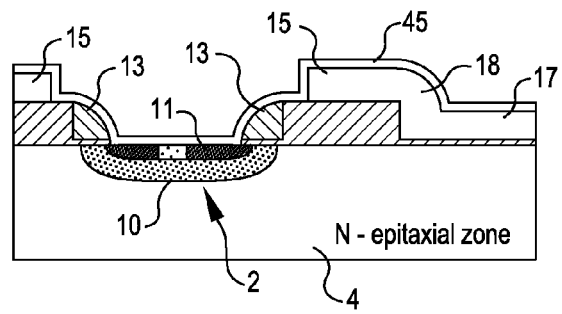
Figure 20E:
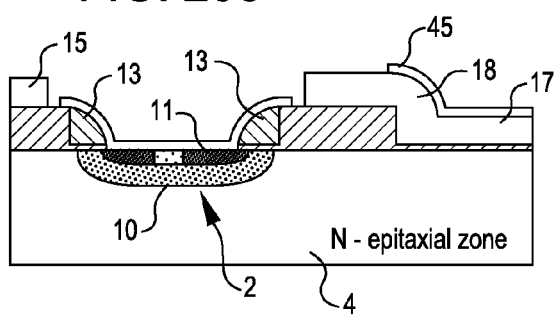
Figure 20F:
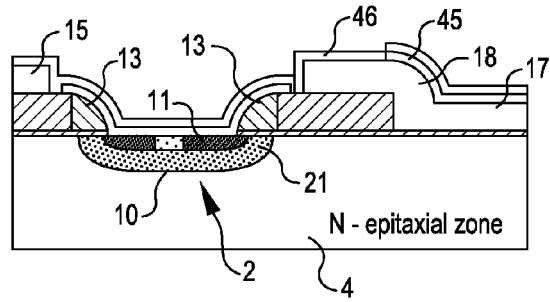
Figure 20G:
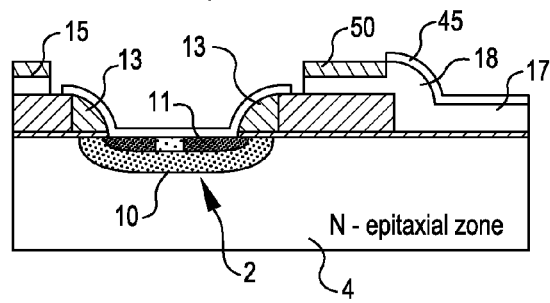
Figure 20H:
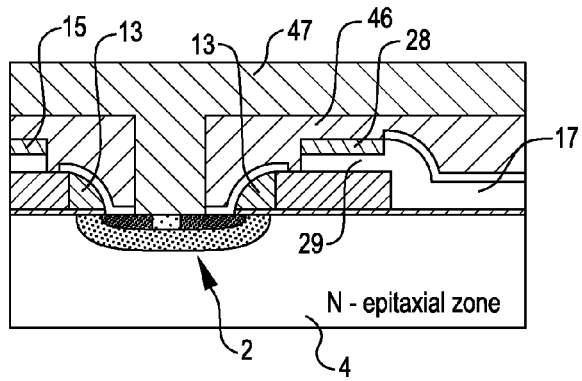

The method may then also include the steps of:

depositing, above the layer 4, an insulating layer 45 of suitable thickness of about 100-5000 Å, as shown in FIG. 20d;

providing a photo-masking of the insulating layer 45 placed above the gate structure 12 except for the upper part of the second conductive portions 15, to thus define suitable areas to be silicided as highlighted in FIG. 20e;

depositing, above the second conductive portions 15, a suitable metallic layer 46 of thickness equal to approximately 200-5000 Å, as shown in FIG. 20f;

carrying out a thermal process or other process suitable to make the metallic layer 46 react with an upper portion of the second conductive portions 15, realized in silicon, which, reacting, define a silicided layer 50;

etching the metallic layer 45 by taking away the part which has not reacted, as highlighted in FIG. 20g;

The method may then include the following completion steps:

covering the structure with a suitable intermediate dielectric layer 47 and forming metallizations 48 on the front and on the rest according to the prior art, suitable to obtain a device as shown in FIGS. 20h, 22 and 23.

The method described according to an embodiment of the present invention realizes a power MOS device comprising a gate structure that separates the gate electrode of the elementary MOS transistors 2 from the distribution mesh of the signal coming from the gate pad, such arrangement obtained by means of a synergy between the layout of the device and a process sequence.

The method realized may be applied to any MOS device characterized by a double gate oxide thickness on whose thick part a conductive mesh is realized and by a conductive gate separated from said conductive mesh and placed on the thin part of the gate oxide and being the two conductive parts placed in electric connection by means of suitable conductive bridges.

An advantage of the power MOS device obtained according to an embodiment of the present invention is that the gate structure allows, on one side, to separate the signal transmission mesh coming from the gate pad from the gate electrode of each elementary MOS transistor and, on the other, it allows, by using a gate oxide with a double level, to harmonize the response during the dynamic step of the power MOS device.

Moreover, a further advantage of an embodiment of the present invention is that the gate structure or mesh is completely self-aligned to the gate electrode of each elementary MOS transistor being obtained through deposition and etching steps. It is thus simpler to be realized and more precise without the use of alignment between masks.

A further advantage of a MOS device realized by means of an embodiment of the present invention is the possibility of having a greater flexibility in the control of the gate resistance in relation to the number of the conductive bridges realized and to their mutual distance. In such way, by means of a suitable layout, it is possible to vary the switch speed of the power MOS device as well as the propagation mode of the driving signal according to application or customer needs.

In particular, an embodiment of the present invention allows distribution of the conduction bridges so that each area between two consecutive bridges has the same gate resistance value $R_{polgate}$ and a minimal value linearly depending on the distance form the gate pad or, if present, on the gate fingers or fingers.

A further advantage linked to the separation between the conductive structure or mesh and the gate electrode of the elementary MOS transistors is that in such way the conductive material placed on the central part of the gate oxide can be transformed into a silicide avoiding all the problems linked to the faultiness or mechanical stress of the gate electrode which remains in conductive material such as polysilicon.

Figure 17:
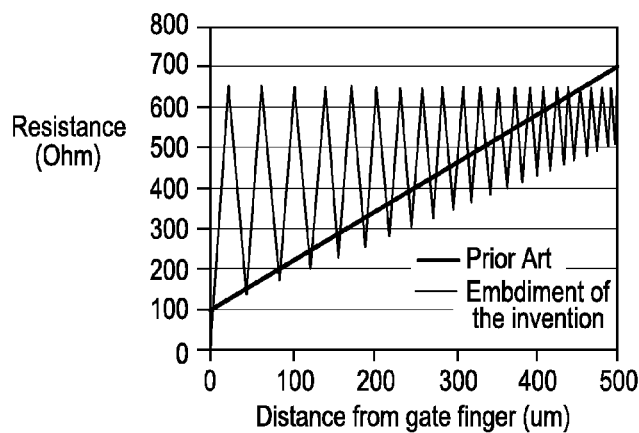
FIGS. 17 and 18 show two diagrams wherein the resistance as seen from an elementary MOS is represented as function of the distance from a gate finger in a comparison between a device realized according to the prior art and according to an embodiment of the present invention.

The power MOS device realized by means of an embodiment of the present invention is particularly satisfying if the resistance gate seen from the elementary MOS transistors is analyzed with respect to all the other techniques currently used in the field. In particular, as it can be seen from the diagram of FIG. 17, there is a more harmonious progress of the resistance value allowing more balancing of the response of the device during a dynamic step.

Figure 18:
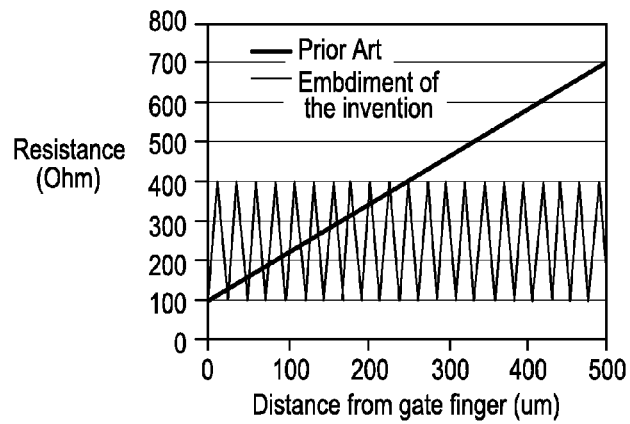

Moreover, an embodiment for realizing the MOS device allows adding or substituting the conduction mesh with a metal which implies enormous advantages on the gate resistance values as highlighted in the diagram of FIG. 18 which allows a considerable increase the switch speed of the MOS device as well as the harmonization of the response during the dynamic step.

The MOS device realized by means of an embodiment of the present invention employs a gate oxide with double thickness in VLSI technology, thus keeping the compatibility with a partial or total siliciding process of the polysilicon.

The solution idea of separating the transmission structure of the signal from the gate electrode of the elementary transistors and of interconnecting them by means of suitable conductive bridges can be naturally used also for other electronic devices maintaining similar advantages.

A MOS devices 1 described above may be part of a larger integrate circuit, which may be part of an electronic system such as the electronic system of an automobile.

From the foregoing it will be appreciated that, although specific embodiments of the invention have been described herein for purposes of illustration, various modifications may be made without deviating from the spirit and scope of the invention.

What is claimed is:

1. A MOS device, comprising:
   a drain region;
   a body region disposed over the drain region and having an inner portion and first and second opposite outer portions;
   a source region disposed over the inner portion of the body region and having first and second opposite sides that are respectively contiguous with the first and second outer portions of the body region;
   a gate electrode having a first portion disposed over the first outer portion of the body region and having a second portion disposed over the second outer portion of the body region and having no portion disposed over the inner portion of the body region;
   a first bridge electrode disposed over the body region and electrically coupling the first and second portions of the gate electrode; and
   a second bridge separate from the first bridge electrode disposed over the body region and electrically coupling the first and second portions of the gate electrode.

2. The MOS transistor of claim 1, further comprising:
   a gate conductor disposed adjacent to the first portion of the gate electrode; and
   wherein the bridge electrode electrically couples the gate conductor to the first portion of the gate electrode.

3. The MOS device of claim 1 wherein:
   the body region has a third outer portion disposed between the first and the second output portions;
   the source region has third side that is contiguous with the third outer portion of the body region; and
   the bridge electrode is disposed over the third outer portion of the body region.

4. The MOS device of claim 1, further comprising:
   wherein the body region has a third outer portion disposed between the first and the second output portions;
   wherein the source region has third side that is contiguous with the third outer portion of the body region;
   a bridge insulator disposed on the third outer portion of the body region; and
   wherein the bridge electrode is disposed over the bridge insulator.

5. A MOS device, comprising:
   a drain region;
   a body region disposed over the drain region and having an inner portion and first and second opposite outer portions;
   a source region disposed over the inner portion of the body region and having first and second opposite sides that are respectively contiguous with the first and second outer portions of the body region;
   a gate electrode having a first portion disposed over the first outer portion of the body region and having a second portion disposed over the second outer portion of the body region and having no portion disposed over the inner portion of the body region;
   a bridge electrode disposed over the body region and electrically coupling the first and second portions of the gate electrode;
   a gate conductor disposed adjacent to the first portion of the gate electrode;
   a first gate insulator having a first portion with a first thickness disposed between the first outer portion of the body region and the first portion of the gate electrode and having a second portion with substantially the first thickness disposed between the second outer portion of the body region and the second portion of the gate electrode;
   a second gate insulator having a second thickness that is greater than the first thickness and disposed beneath the gate conductor; and
   wherein the bridge electrode electrically couples the gate conductor to the first portion of the gate electrode.

6. An integrated circuit, comprising:
   a MOS device, comprising,
   a drain region,
   a body region disposed over the drain region and having an inner portion and first and second opposite outer portions,
   a source region disposed over the inner portion of the body region and having first and second opposite sides that are respectively contiguous with the first and second outer portions of the body region,
   a gate electrode having a first portion disposed over the first outer portion of the body region and having a second portion disposed over the second outer portion of the body region and having no portion disposed over the inner portion of the body region, and
   a bridge electrode disposed over the body region and electrically coupling the first and second portions of the gate electrode, the gate electrode having a length and a width such that the length is greater than the width and comprises a first lengthwise end coupled to the first portion of the gate electrode and a second lengthwise end coupled to the second portion of the gate electrode.

7. A system, comprising:
   a MOS device, comprising,
   a drain region,
   a body region disposed over the drain region and having an inner portion and first and second opposite outer portions,
   a source region disposed over the inner portion of the body region and having first and second opposite sides that are respectively contiguous with the first and second outer portions of the body region,
   a gate electrode having a first portion disposed over the first outer portion of the body region and having a second portion disposed over the second outer portion of the body region and having no portion disposed over the inner portion of the body region, and
   a bridge electrode disposed over the body region and electrically coupling the first and second portions of the gate electrode such that the gate electrode and the bridge electrode form a mesh of conductive material.

8. A MOS device, comprising:
   a plurality of drain regions;
   a plurality of body regions, each disposed over one of the plurality of drain regions and each having an inner portion and first and second opposite outer portions;
   a plurality of source regions each disposed over one of the inner portions of one of the body regions and each having first and second opposite sides that are respectively contiguous with one of the first and second outer portions of one of the body regions;
   a plurality of gate electrodes each having a first portion disposed over one of the first outer portions of one of the body regions and each having a second portion disposed over one of the second outer portions of one the body regions; and a plurality of bridge electrodes each disposed over one of the body regions and each electrically coupling one of the first and second portions of one of the gate electrodes in a mesh pattern.

9. The MOS transistor of claim 8, further comprising:

a gate conductor disposed adjacent to the first portion of at least one gate electrode; and wherein at least one bridge electrode electrically couples the gate conductor to the first portion of the at least one gate electrode.

10. The MOS device of claim 8 wherein:

at least one of the body regions has a third outer portion disposed between the first and the second output portions;

at least one of the source regions has third side that is contiguous with the third outer portion of the at least one body region; and at least one bridge electrode is disposed over the third outer portion of the at least one body region.

11. The MOS device of claim 8, further comprising:

wherein at least one body region has a third outer portion disposed between the first and the second output portions;

wherein at least one source region has third side that is contiguous with the third outer portion of the body region;

a bridge insulator disposed on the third outer portion of the at least one body region; and wherein at least one bridge electrode is disposed over the bridge insulator.

12. A MOS device, comprising:

a plurality of drain regions;

a plurality of body regions, each disposed over one of the plurality of drain regions and each having an inner portion and first and second opposite outer portions;

a plurality of source regions each disposed over one of the inner portions of one of the body regions and each having first and second opposite sides that are respectively contiguous with one of the first and second outer portions of one of the body regions;

a plurality of gate electrodes each having a first portion disposed over one of the first outer portions of one of the body regions and each having a second portion disposed over one of the second outer portions of one the body regions;

a plurality of bridge electrodes each disposed over one of the body regions and each electrically coupling one of the first and second portions of one of the gate electrodes;

a gate conductor disposed adjacent to the first portion of at least one gate electrode;

a first gate insulator having a first portion with a first thickness disposed between the first outer portion of at least one body region and the first portion of the at least one gate electrode and having a second portion with substantially the first thickness disposed between the second outer portion of the at least one body region and the second portion of the at least one gate electrode;

a second gate insulator having a second thickness that is greater than the first thickness and disposed beneath the gate conductor; and wherein at least one bridge electrode electrically couples the gate conductor to the first portion of the at least one gate electrode.

13. A MOS device, comprising:

a drain region;

a body region disposed over the drain region and having an inner portion and first and second opposite outer portions;

a source region disposed over the inner portion of the body region and having first and second opposite sides that are respectively contiguous with the first and second outer portions of the body region;

a gate electrode having a first portion disposed over the first outer portion of the body region and having a second portion disposed over the second outer portion of the body region, each portion of the gate electrode having a length and no portion of the gate electrode disposed over the inner portion of the body region; and a bridge electrode disposed over the body region intersecting each the first and second portions of the gate electrode at a middle point of the length, the bridge electrode electrically coupling the first and second portions of the gate electrode.

* * * * *